United States Patent [19]

Decker et al.

[11] Patent Number: 5,754,643
[45] Date of Patent: May 19, 1998

[54] WEATHERABLE OUTSIDE ELECTRONIC DEVICE ENCLOSURE

[75] Inventors: Robert LeRoy Decker, Parsippany; Philip Hubbauer, Millington; William Roger Lambert, Chester; Lloyd Shepherd, Madison; George John Shevchuk, Old Bridge; John David Weld, Succasunna, all of N.J.

[73] Assignee: Lucent Technologies Inc., Murray Hill, N.J.

[21] Appl. No.: 537,372

[22] Filed: Oct. 2, 1995

[51] Int. Cl.[6] .................... H04M 1/00; A47G 19/22
[52] U.S. Cl. .................. 379/399; 379/441; 428/34.7; 428/394
[58] Field of Search .................. 379/399, 377; D14/140, 240, 256; 361/737; 428/152, 198, 389, 34.7, 35.7, 36.5, 41.5, 65.1; 523/200–208

[56] References Cited

U.S. PATENT DOCUMENTS

| | | | |
|---|---|---|---|
| Re. 28,982 | 9/1976 | Crawford et al. | 260/873 |
| D. 287,583 | 1/1987 | Smith et al. | D14/240 |
| D. 300,923 | 5/1989 | Collins | D13/156 |
| D. 314,385 | 2/1991 | Karan et al. | D14/140 |
| D. 327,055 | 6/1992 | Derbyshire | D13/156 |
| D. 327,071 | 6/1992 | Derbyshire | D14/256 |
| D. 342,523 | 12/1993 | Morgan et al. | D14/114 |
| 3,765,998 | 10/1973 | Oswald et al. | 161/170 |
| 3,912,348 | 10/1975 | Seymour | 312/100 |
| 4,236,774 | 12/1980 | Diaz | 312/351 |
| 4,245,274 | 1/1981 | MacDonald et al. | 361/429 |
| 4,264,667 | 4/1981 | Murakami et al. | 428/195 |
| 4,264,672 | 4/1981 | Taylor-Brown et al. | 428/310 |
| 4,268,570 | 5/1981 | Imanaka et al. | 428/216 |
| 4,289,361 | 9/1981 | Riedel | 312/100 |
| 4,672,510 | 6/1987 | Castner | 361/415 |
| 4,676,164 | 6/1987 | Carter et al. | 102/204 |
| 4,810,829 | 3/1989 | Rutenbeck et al. | 174/41 |
| 4,877,831 | 10/1989 | Hongo et al. | 525/63 |
| 4,910,770 | 3/1990 | Collins et al. | 379/399 |
| 4,945,559 | 7/1990 | Collins et al. | 379/399 |
| 4,945,560 | 7/1990 | Collins et al. | 379/399 |
| 4,949,376 | 8/1990 | Nieves et al. | 379/399 |
| 5,001,602 | 3/1991 | Suffi et al. | 361/724 |
| 5,111,362 | 5/1992 | Flamm et al. | 361/395 |
| 5,153,910 | 10/1992 | Mickelson et al. | 379/399 |
| 5,153,911 | 10/1992 | Smith | 379/399 |
| 5,235,638 | 8/1993 | Dondero | 379/399 |
| 5,247,135 | 9/1993 | Rebers et al. | 174/92 |
| 5,271,258 | 12/1993 | Bernier et al. | 72/348 |
| 5,271,855 | 12/1993 | Hoefer et al. | 252/32 |
| 5,291,553 | 3/1994 | Smith | 379/399 |
| 5,306,778 | 4/1994 | Ishida et al. | 525/310 |
| 5,313,519 | 5/1994 | Mickelson et al. | 379/399 |
| 5,355,408 | 10/1994 | Landquist et al. | 379/397 |
| 5,357,565 | 10/1994 | Butler, III et al. | 379/412 |
| 5,359,654 | 10/1994 | Jensen et al. | 379/397 |
| 5,406,456 | 4/1995 | Hsu | 361/752 |
| 5,480,718 | 1/1996 | Shigemoto et al. | 428/342 |
| 5,502,095 | 3/1996 | Ueshima et al. | 524/269 |
| 5,530,622 | 6/1996 | Takiar et al. | 361/737 |

*Primary Examiner*—Daniel S. Hunter
*Assistant Examiner*—Jacques M. Saint-Surin

[57] ABSTRACT

A network interface device includes a weatherable enclosure having injection molded, die cast, or stamped top and bottom cap portions and a body portion which is extruded. The injection molded portions are fabricated from a polymer, such as polyvinyl chloride, with a higher melt index than the grade of polymer used to fabricate the body portion. The body portion has top and bottom openings adapted to receive the top and bottom cap portions. The network interface electrical components are enclosed within the housing.

20 Claims, 2 Drawing Sheets

WEATHERABLE OUTSIDE ELECTRONIC DEVICE ENCLOSURE

BACKGROUND OF THE INVENTION

1. Field of the Invention

The present invention relates to a plastic protective enclosure for an active electronic device which is mounted outdoors.

2. Description of the Related Art

Network interface devices (NIDs) are units which allow connection between an outside network, such as a telecommunications service provider transmission line, and customer premises equipment. Such devices provide a physical interface or point of access to enable capabilities such as testing, maintenance, service enhancement or modification, and safety. The location of such equipment may be at the customer premises or at any other point of the network. Many NIDs are simple unpowered (passive) splice connections within enclosures having a hinged attached cover member. Other NIDs protect various types of active electronic circuitry. Examples of NIDs are provided in U.S. Pat. Nos. 5,357,565; 5,355,408; 5,313,519; 5,291,553; 5,235,638; and 5,153,911.

Network interface devices are typically mounted outdoors in unsheltered locations where access by the telecommunications service provider is readily available. Therefore, such devices are subject to environmental weathering conditions which can be severe. Enclosures for such devices are often fabricated from polymeric materials in order to accommodate the need for high volume manufacturing and low cost. However, extreme ranges in temperature, wind, precipitation, ultraviolet light ("UV"), and other such factors cause degradation of the polymers and thereby shorten the useful life of the enclosure and devices they protect.

The primary purpose of the NID enclosure is to protect and maintain the internal electronics during the expected service life of the product. There are several desirable features for a suitable outside NID enclosure.

First, the enclosure should be able to be produced at low cost and in high volume. While metals meet many of the features listed below, enclosures fabricated therefrom are relatively expensive and difficult to fabricate in the volumes needed for practical production.

Second, the enclosure should be weatherable. It should withstand the wide range of environmental stresses and should exhibit a useful service life of at least ten years.

Third, it should have high impact strength to resist breakage when, for example, hit by wind blown debris, or otherwise physically struck. The impact strength should be maintained throughout the product life and over a wide temperature range, for example, −40° C. to 60° C.

Fourth, it should be non-flammable or at least flame retardant. The degree of flame retardancy depends upon the physical location of the equipment and the pertinent installation requirements.

Fifth, it is desirable that the housing provide shielding for electromagnetic radiation ("EMI").

Sixth, the enclosure should be resistant to solvents to the extent that the mechanical properties are not compromised.

Seventh, the enclosure should have sufficient heat resistance to withstand the combined influence of solar thermal load, thermal dissipation of the internal electronics as well as the ambient temperature such that the physical and mechanical properties are maintained. A typical heat resistance temperature standard is 160° F.

Eighth, the product should maintain the intended aesthetic qualities.

The plastic NID enclosures are typically fabricated by molding. With injection molded NID enclosures, there is no injection moldable thermoplastic material and product design which optimally satisfy all of the product requirements. In part, this is the consequence of the constraints imposed on the materials and the part design by the injection molding fabrication process. For example, injection molding grades of PVC (polyvinyl chloride) meet most of the aforementioned requirements but possess an unacceptably low heat distortion temperature.

By considering the fabrication of the NID enclosure using alternative plastic processing methods, and specifically as it relates to the subject of this invention, extrusion fabrication, the previously referred to material and design constraints can be circumvented, the combined requirements can be more optimally satisfied, and the ability of the NID enclosure product to ensure the reliability of the internal electronics during the anticipated service life can be enhanced.

SUMMARY OF THE INVENTION

A network interface device is provided herein which includes a weatherable enclosure fabricated from first and second polymeric materials. The enclosure includes top and bottom end cap portions which are fabricated from the first polymeric material by molding (e.g., injection molding), and a body portion fabricated from the second polymeric material by extrusion. The body portion has top and bottom openings adapted to receive the top and bottom end caps which may be affixed into position by, for example, bonding, welding, or mechanical fastening/joining. By virtue of the different processing methods, the first polymeric material may have a molecular weight which is less than that of the second polymeric material. The second polymeric material has a specific impact strength of at least about 5 ft./lbs. A preferred material of construction is polyvinyl chloride wherein the first polymeric material is polyvinyl chloride having a molecular weight in the range of 50,000 to 70,000 (Inherent Viscosity ("IV") according to ASTM D1243-58T of about 0.5 to about 0.6), and the second polymeric material is polyvinyl chloride having a higher molecular weight greater than about 150,000 (IV greater than 0.9) (See, e.g., J. A. Brydson, *Plastic Material*, Fifth Edition, Butterworths, Boston, 1989).

A more general way of differentiating the first and second polymeric materials is to designate them as injection molding and extrusion grades, respectively. From an engineering perspective, the processability of a thermoplastic depends upon several factors, such as the molecular weight of the matrix polymer, crosslinking densities, thermal processing history, and the presence of additives. Injection molding and extrusion grades of a given thermoplastic material can then be differentiated in terms of the melt index, equivalent to the melt flow rate, according to standard methods such as ASTM D1238 or ISO R1133/R292. In general, injection molding grades relevant to the first polymeric material exhibit a melt index (gm/10 min, ASTM D1238) of from 5 to 100 gm/10 min, and extrusion grades relevant to the second polymeric material exhibit a melt index between approximately 0.1 and 1 gm/10 min. (See, e.g., D. V. Rosato, *Rosato's Plastic Encyclopedia and Dictionary*, Hanser Publishers, N.Y., 1993).

BRIEF DESCRIPTION OF THE DRAWINGS

So that one skilled in the art to which the subject invention appertains will better understand how to practice the present invention, preferred embodiments of the method will be described in detail hereinbelow with reference to the drawings, wherein.

DETAILED DESCRIPTION OF THE PREFERRED EMBODIMENT(S)

The present invention employs more than one fabrication technique and grade of material in order to realize an NID enclosure with optimum practical properties at low cost and commensurate with high volume manufacturing methods. More specifically, the present method employs molding (e.g., injection molding) of some parts of the NID enclosure and extrusion of another part. Injection molding is a known and commonly used technique of manufacture to obtain intricate shapes from thermoplastic materials. Further information is available in the Encyclopedia of Polymer Science and Engineering, Volume 13, pgs. 660–665, (1988 ed.), herein incorporated by reference as to the article on injection molding. Extrusion is more economical because fabrication is a continuous process and the polymer resins are less complex, but to some extent extrusion can also be more limited in the shape of part which can be produced. Extrusion produces an elongated body with substantially the same cross-section throughout its length. Further information is available in the Encyclopedia of Polymer Science and Engineering, Volume 6, pgs. 571–631 (1986 ed.), herein incorporated by reference as to the article on extrusion. However, shapes such as closed structural members and zero-draft features (parallel surfaces) can only economically be produced by means of extrusion. Internal structures such as tubes and chambers can easily be accommodated with extrusion. Furthermore, as will be discussed, combining materials to provide enhanced capabilities can be facilitated with the extrusion process. Extrusion also enables fabrication of a part with a range of wall thicknesses whereas injection molding is most amenable to fabricating parts with a constant wall thickness throughout the part. In extrusion the wall thickness will be substantially constant in the direction of flow but can vary significantly throughout the part. The cross-section of an injection molded part is generally limited to a maximum thickness of about 0.150 inches whereas an extruded cross-section can be substantially greater than 0.150 inches thick. The greater wall thickness will produce a part which is mechanically more robust. In comparison to injection molding, extrusion is performed at lower pressures which minimizes molded-in and residual stress, and at lower temperatures which results in less thermal degradation of the polymer resin. Also, the need for additives such as mold release and thermal stabilizers are less stringent for extrusion processing.

Figure 1:
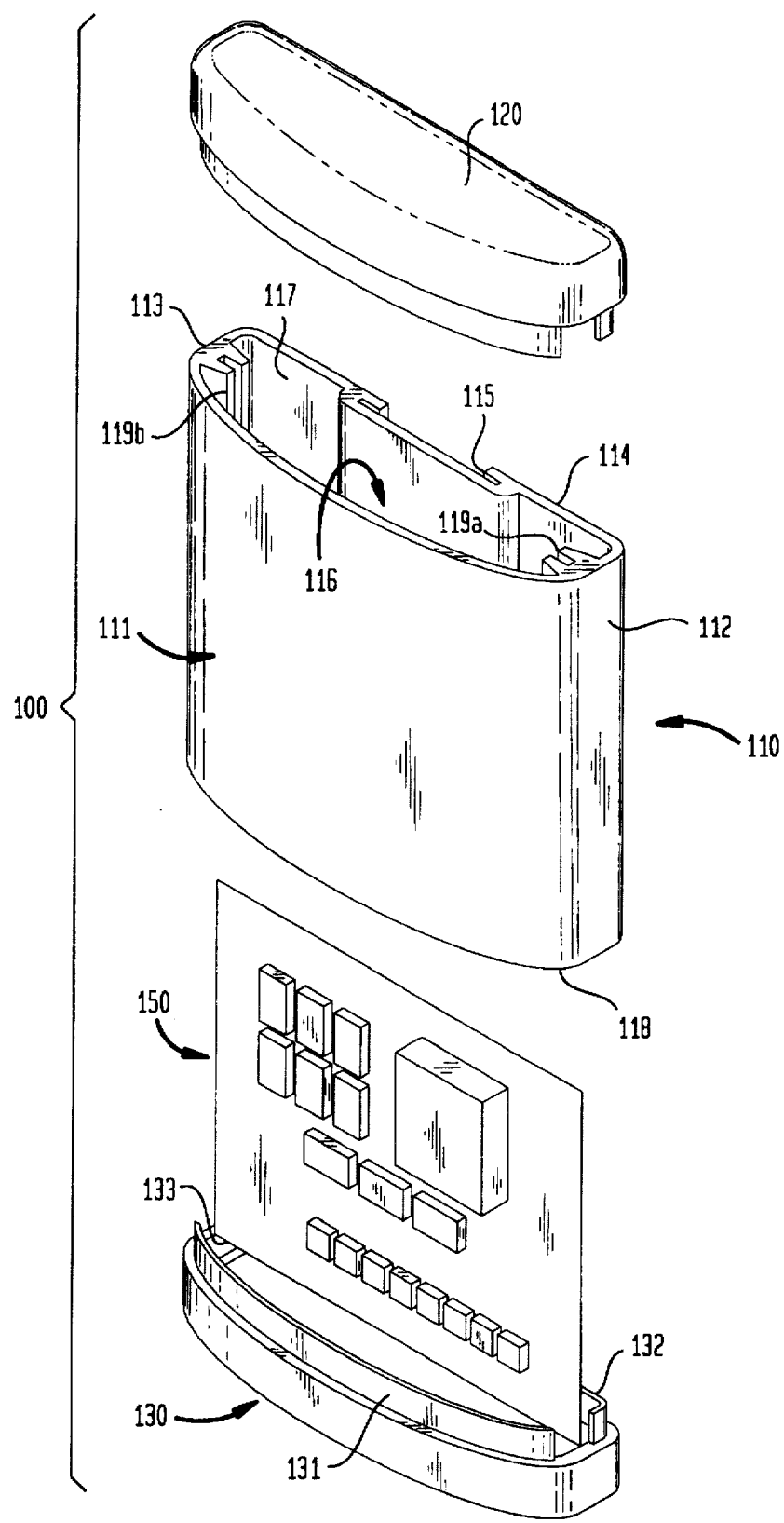
FIG. 1 is an exploded perspective view of the invention.

More specifically, referring to FIG. 1, a preferred embodiment of a network interface device 100 is shown which includes an enclosure comprising a body portion 110, top end cap 120 and bottom end cap 130, and a network interface functionality which is illustrated as a circuit board 150.

The body portion 110 of the enclosure is preferably fabricated from PVC which is extruded to form the desired shape. PVC is preferred because of its relatively low cost. While PVC is referred to herein as the preferred material of construction, other thermoplastic polymeric resins are also contemplated as fabrication materials, such as polymers of styrene, acrylonitrile, butadiene, acrylates, polycarbonates, polyolefins, nylons, liquid crystal polymers, thermoplastic elastomers, polyurethanes, polybutylene terephthalate, polysulfones, polyacetals, PPO base resins, and polyesters including copolymers and/or blends of these resins with or without PVC. Also, the PVC or other polymers can contain additives such as hydroxy-phenyl benzotriazoles, hindered-amine light stabilizers, benzophenone and benzotriazole type UV absorbers, Sn/S and Ba/Cd carboxylate thermal stabilizers and/or inorganic light scatterers or absorbers such as $TiO_2$ or carbon black, respectively, and/or other compounds to enhance the resistance to U.V. and thermal degradation. Other additives may be included to enhance, for example, thermal stability or processability. PVC has an inherent flame retardance and exhibits good weatherability. Other thermoplastics may or may not require the incorporation of flame retardants.

The use of extrusion grade plastic to fabricate the body portion 110 provides several advantages. As has previously been discussed, the melt index is inversely proportional to the inherent polymer viscosity and the average polymer molecular weight. The exact relationship is empirical for each polymer. For the properties relevant to the NID enclosure discussed herein, tensile strength, chemical resistance, heat resistance (heat distortion temperature), environmental stress crack resistance, fatigue resistance, abrasion resistance and impact strength increase with decreasing melt index and are considerably improved over injection molding grades of the same plastic (See, e.g., D. V. Rosato, *Rosato's Plastic Encyclopedia and Dictionary*, Hanser Publishers, New Yprk, 1993, and G. Gruenwald, *Plastics—How Structure Determines Properties*, Hanser Publishers, New York, 1992). Low melt index thermoplastic grades, typically between 0.1 and 1.0 gm/10 min., are used for extrusion molding. The body portion 110 is therefore to be fabricated with a low melt index (i.e., melt index preferably no greater than about 1.0 gm/10 min.), extrusion grade plastic which exhibits enhanced performance attributes compared to a high melt index, injection molding grade resin of the same plastic. More preferably, the body portion is fabricated from a plastic having a melt index no greater than about 0.5 gm/10 min., and most preferably a melt index no greater than about 0.2 gm/10 min. Extrusion and injection molding grades of PVC are available from the GEON Company of Cleveland, Ohio.

Advantageously, extrusion permits the pultrusion and/or coextrusion of different materials. Thus, reinforcement fibers or multiple layers of different polymers or different grades of the same polymer may be pultruded to form a composite structure. Reinforcement material can include glass fibers, carbon fibers, aramid fibers, and polyacrylonitrile fibers, for example. Extrusion permits the economical incorporation of longer length fibers into the polymer matrix than is possible with injection molding technology, which can thereby enhance the mechanical properties of the part and specifically the thermal stability. Further information about producing fiber-reinforced lengths of solid or composite material may be found in the Encyclopedia of Polymer Science and Engineering, Volume 8, pgs. 10–137 (1987 ed.), herein incorporated by reference as to the article on pultrusion. Also, recycled plastic may be coextruded as an interior layer and higher grade weather resistant plastic may be used as an exterior layer. Coextrusion lends itself to the fabrication of multi-layer structures where each layer provides a desired attribute such as a UV resistant film, color and aesthetics, foamed thermoplastic to provide mechanical integrity or thermal insulation, barrier protection, for example, water vapor permeability, and EMI shielding. Thin film coextrusion technology is well known in the food packaging industry. The body portion may also be coated with a metal film which is electrically grounded to serve as electromagnetic interference ("EMI") shielding. Such coating processes are known in the art.

Referring again to FIG. 1, the single piece body portion 110 includes a front panel 111, a back panel 114, and two side panels 112 and 113 which define an interior space 116, a top opening 117, and a bottom opening 118. The front panel 111 is preferably convexly curved. Side panels 112 and 113 preferably include interior vertical slots or grooves, or raceways 119a and 119b, respectively, designed to receive a circuit board or other operational equipment by means of sliding or insertion. Back panel 114 can optionally include a mounting slot 115 to facilitate mounting of the enclosure 100 on a suitable mounting bracket. By way of illustration, the body portion 110 can typically be from about 5 inches to about 12 inches in height, about 5 inches to about 12 inches in width and about 1 inch to about 5 inches in depth.

Optionally, the wall thickness of the back panel 114 can be less than that of the front panel 111 or the side panels 112 and 113, to make more cost efficient use of the plastic as well as to maximize the mechanical strength in the areas where it is most important. By way of illustration, for a PVC housing the wall thickness of the front and side panels (111, 112, and 113) can be from about 0.090 inches to about 0.250 inches and back panel 114 wall thickness can range from about 0.060 inches to about 0.150 inches.

Another advantageous feature of extrusion is that internal cavities or cells can easily be incorporated into the design. One particular feature would be the inclusion of an internal box structure which would surround the circuit pack. These internal structures can provide enhanced rigidity and impact strength and serve as a barrier to humidity and dust, thereby providing additional protection to the circuits.

Top end cap 120 and bottom end cap 130 are injection molded from PVC having a melt index of from about 5 to 100 gm/10 min. The shape of the top and bottom end caps cannot be produced by extrusion. Injection molding is preferred since it permits the fabrication of intricate shapes. (Other methods and processes, such as thermoforming, stamping die casting, etc. may also be used to make the end caps, and the fabrication material for the end caps need not be restricted to thermoplastics and can include metals.) However, injection molding is generally a more expensive and capital intensive process than extrusion. Unlike extrusion, injection molding cannot be satisfactorily used with polymers which have a low melt index. To obtain a higher overall impact strength for the manufactured structure requires thicker structural walls, and, hence, the use of more material or the use of expensive high impact grades of injection molding grade thermoplastics. The latter is generally the preferred solution since the practical thickness of injection molded parts is limited to about 0.150 inches. Thick injection molded parts are difficult to process without the appearance of sink marks and, due to the large volume of plastic which needs to be cooled, requires longer cycle times, which substantially increases the manufactured part cost. However, unlike the front panel 111 and side panels 112 and 113, the end cap portions are not expected to undergo severe impact. Hence, one may economically employ high melt index, high impact strength injection molding grade plastic for the end cap portions without sacrificing the quality or cost effectiveness of the final product, provided that the body portion 110 is fabricated by extrusion. High melt index, injection molding grade PVC is available from The GEON Company. As with the extruded body portion 110, other types of polymers such as those mentioned above may be used for end cap portions 120 and 130 instead of PVC, or may be used as blends or copolymers with PVC. The end cap material may contain various additives or stabilizers to enhance the durability and performance of the part.

The top cap 120 is configured and dimensioned so as to engage top opening 117 of the body portion. Bottom cap position 130 is configured and dimensioned so as to engage the bottom opening 118 of the body portion 110. Projections on the end cap portions 120 and 130 facilitate insertion and alignment of the end cap portions into the respective openings of the body portion 110. For example, projections 131 and 132 of the bottom end cap 130 are configured and dimensioned to friction fit within opening 118 to secure the end cap portion 130 thereto. A notch portion 133 is adapted to mount equipment such as a circuit board 150. The end cap portions 120 and 130 may be sealed to body portion 110 by known methods such as bonding (adhesive, solvent or induction), welding (ultrasonic, vibration, or thermal), and mechanical fastening (e.g., friction or snap fit). Alternatively, portions 120 and 130 may be retractable to provide for service access and the environmental seal made by means of a gasket or a compression fit. Some mechanism for freeing the parts would be incorporated into the design. Sections 120, 110 and 130 may be connected such that the enclosure is completely and permanently sealed, separable for intermittent access, and/or an opening or vent may be incorporated to provide limited air flow.

The network interface means can be an electrical or fiber optic connector or connectors, or it can include unpowered or powered circuitry to perform various functions such as switching, and signal modification such as filtering, signal enhancement and the like. Various types of network interface means are known in the art and may be incorporated into the present enclosure.

An advantage of the present enclosure is that delicate circuit components including powered integrated circuits may be securely enclosed and protected against environmental conditions over a long period of time.

For practical application as a network interface device, the enclosure must also incorporate a means for interconnection to the telecommunications network as well as to the customer premises equipment. For security and reliability reasons it is desirable that the cable interconnects be situated within, and not on the outside of the enclosure. To accomplish this, cutouts or slots which contain grommets, O-rings, or other sealing and cable securing features and mechanisms are to be included in the bottom end cap 130. Typically, two slots, one for cable entry from the outside plant, and another for entry to the customer premises equipment, would be sufficient. Depending upon the application and the number and design of the cables entering the unit, a fewer or greater number of slots could be required. The cables would be interconnected to the active devices or printed circuit board by many methods which are well known to those skilled in the art. The slots are preferably situated on the bottom end cap 130 for aesthetic reasons as well as to minimize the potential for moisture ingress through and around the cable seals.

Figure 2:
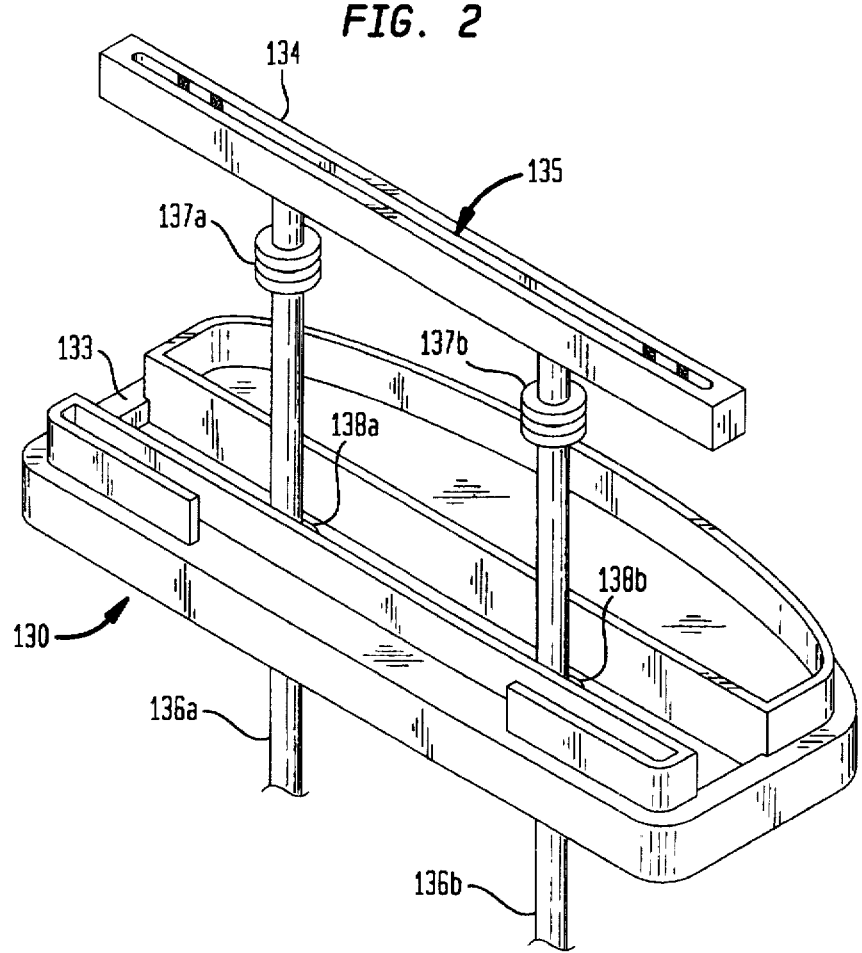
FIG. 2 is a perspective view of the bottom cap portion.

For example, referring to FIG. 2, bottom cap portion 130 can include openings 138a and 138b through which cables 136a and 136b are respectively disposed. Cables 136a and 136b, are connected to a circuit board holder 134 having receptacle slot 135. The circuit board holder 134 is seated within slot 133 of the bottom cap portion. Circuit board holder 134 provides means to electrically connect cables 136a and 136 to the circuit board 150. Sealing plugs 137a and 137b are fabricated from a resilient material and are disposed within openings 138a and 138b, respectively, to engage and hold the cables 136a and 136b and to seal the openings 138a and 138b. Such plugs are known and commonly available. The circuit board 150 can be mounted within receptacle slot 135. One of the cables 136a and 136b is connected to the telecommunication service provider network and the other provides entry to the customer equipment.

As has previously been alluded to, it may be necessary for customers to have limited access to certain portions of the active electronics for test and maintenance purposes. One method for providing this capability is to enable the end cap 130 and circuit board 150 assembly to drop down a certain, predefined distance, thereby exposing test points and/or other components, while preventing access to other components such as cable connectors, sensitive electronics, high voltage parts, etc.

One means to accomplish this is to place a locked restraining mechanism at the bottom of slot 119 and/or 119b. The lock would be such that it could only be opened by craft access personnel. A cut-out on the outer edges of the printed wiring board would define the extent to which the circuit board 150 and the attached end cap 130 could be lowered. Other methods may be employed as required by the design of the electronics and the end use specifications.

Another means for providing limited customer access to test points located on the printed circuit board is by means of holes in the bottom end cap 130. The access holes would be sealed using a self-sealing silicone gel elastomer or other such sealant material through which probes could be inserted to make electrical contact with the test points and retracted such that the seal of the elastomer is reformed. The silicone material or other sealing compound will provide environmental protection for the internal NID electronics. Such sealing materials are well known to those skilled in the art and are available from G.E. Silicones in Waterford, N.Y. This may be the most preferred method since access does not require breaking the environmental seal between the end cap 130 and the body of the enclosure 110 and, in practice, the need for customer access is expected to be limited.

Figure 3:
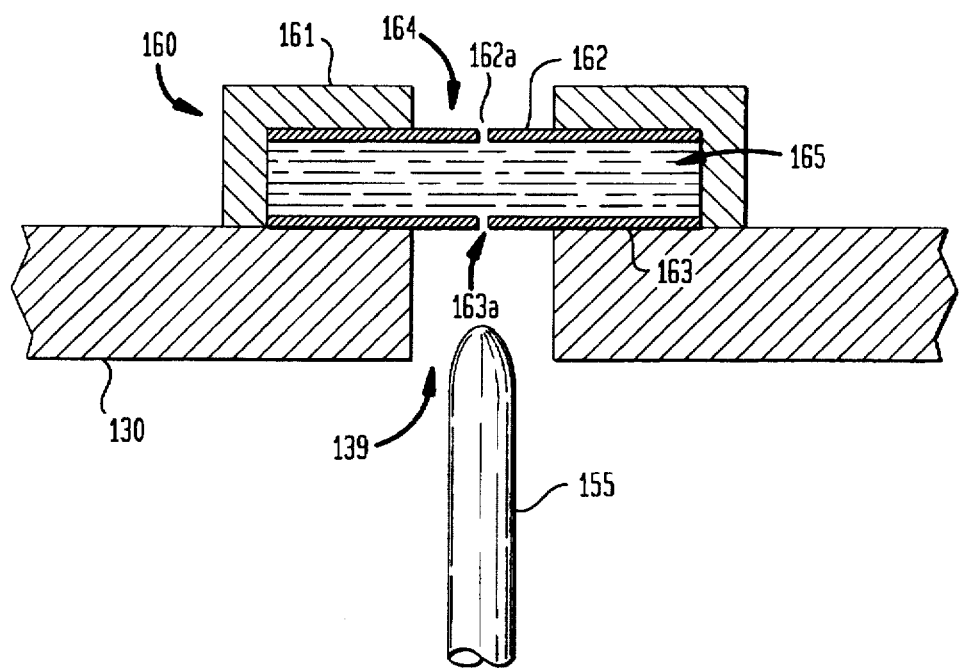
FIG. 3 is a sectional elevational view of a sealed access means for a testing probe.

Referring to FIG. 3, a means for providing access to test points within the enclosure 100 while maintaining an environmental seal is illustrated. The bottom cap portion 130 has an opening 139 through which test probe 155 can be inserted. A self-sealing means 160 is positioned on the interior surface of the bottom cap portion and includes a housing 161 and elastic membranes 162 and 163. A viscous silicone gel elastomer 165 is enclosed within a chamber defined by the housing 161 and the elastic membranes. The membranes 162 and 163 each include a small puncture openings 162a and 163a, respectively, which are small enough to retain gel 165 in the chamber. Membranes 162 and 163 can be fabricated from sheets of synthetic or natural elastomers. Housing 161 can be fabricated from metal or plastic. An opening 164 is included in housing 161, the diameter of opening 164 being sufficient to accommodate probe 155. When the probe 155 is inserted through the sealing means 160, puncture openings 163a and 162a stretch to accommodate the diameter of the probe 155. Upon withdrawal of the probe 155 the puncture openings elastically return to their original size. Use of membranes 162 and 163 is optional. Self-sealing elastomeric gel materials can be sufficiently viscous to preclude the need for retaining membranes such as membranes 162 and 163. Such viscous sealing gel materials are available from G.E. Silicones, Waterford, N.Y.

When this method is used to provide customer access, the end cap 130 and enclosure body 110 can be locked using custom designed pins. No mechanism will completely secure the enclosure. The locking mechanism is intended simply to restrict easy customer access.

Although the subject invention has been described with respect to preferred embodiments, it will be readily apparent to those having ordinary skill in the art to which it appertains that changes and modifications may be made thereto without departing from the spirit or scope of the subject invention as defined by the appended claims. For example, while the present disclosure is directed to network interface devices, it should be appreciated that any type of electrical, electronic, or computer equipment may be advantageously housed in the enclosure described herein. While the enclosure is advantageously used outdoors, it can also be used indoors. Furthermore, while this invention disclosure has focused on the design and fabrication of an enclosure intended to protect electronic telecommunications equipment, commonly referred to as a network interface device, other equipment and devices, such as optical, radio frequency, computer, and other hardware, can also advantageously be protected by the enclosure described herein.

What is claimed is:

1. A network interface device, which comprises:
   a) an enclosure which includes a top cap portion, a bottom cap portion, and a body portion, said top and bottom cap portions being fabricated from a first polymeric material having a melt index greater than that of said second polymeric material, and said body portion being extruded from a second polymeric material, said second polymeric material having a melt index no greater than about 1.0 gm/10 min., said body portion including top and bottom openings adapted to receivably engage said top and bottom cap portions respectively, and said housing substantially completely enclosing said interface means;
   b) interface means for electrically interconnecting telecommunications equipment or other network system, said interface means being enclosed within said housing.

2. The network interface device of claim 1 wherein said first polymeric material is a polyvinyl chloride resin having a melt index of at least about 5 gm/10 min.

3. The network interface device of claim 2 wherein said second polymeric material is a polyvinyl chloride resin having a melt index no greater than about 1 gm/10 min.

4. The network interface device of claim 1 wherein said body portion includes a reinforcement material incorporated therein.

5. The network interface device of claim 4 wherein said reinforcement material is a fibrous material selected from the group consisting of glass fibers, carbon fibers, aramid fibers, and polyacrylonitrile fibers.

6. The network interface device of claim 1 wherein said body portion further includes at least a coextruded third polymeric material with said second polymeric material to form a layered composite body.

7. The network interface device of claim 1 wherein said interface means comprises a powered circuit board.

8. The network interface device of claim 1 further including means for providing access to at least one cable and means for connecting a cable to said interface means.

9. The network interface device of claim 1 further including access means for providing a sealed passageway for insertion therethrough of a test probe.

10. An enclosure for an electronic device, which comprises:
   a) top and bottom cap portions injection molded from a first polymer having a melt index of at least about 5 gm/10 min.;
   b) a body portion extruded from a second polymer having a melt index no great than about 1 gm/10 min., said body portion having top and bottom openings adapted to receivably engage said top and bottom cap portions.

11. The enclosure of claim 10 wherein said second polymer is polyvinyl chloride having a melt index no greater than about 0.5 gm/10 min.

12. The enclosure of claim 10 wherein said second polymer is polyvinyl chloride having a melt index no greater than about 0.2 gm/10 min.

13. The enclosure of claim 10 wherein at least said body portion includes a metal coating.

14. The enclosure of claim 10 wherein reinforcement material is incorporated into said second polymer of said body portion.

15. The enclosure of claim 14 wherein said reinforcement material is a fibrous material selected from the group consisting of glass fibers, carbon fibers, aramid fibers, and polyacrylonitrile fibers.

16. The method of claim 10 wherein said body portion is a layered composite body.

17. The enclosure of claim 10 wherein said bottom cap portion includes access means for providing a sealed passageway for insertion therethrough of a test probe.

18. The enclosure of claim 10 further including means for providing access to at least one cable and means for connecting a cable to an interface means.

19. The enclosure of claim 10 wherein said bottom and/or top cap portions are fabricated by means of die casting or stamping metal.

20. An enclosure for an electronic device, which comprises:
   a) top and bottom cap portions injection molded from a first polymer having a melt index of at least about 5 gm/10 min.;
   b) a body portion extruded from a second polymer having a melt index no greater than about 1 gm/10 min., said body portion having top and bottom openings adapted to receivable engage said top and bottom cap portions, wherein said body portion incorporates a double box structure.

* * * * *